(12) United States Patent
Dong et al.

(10) Patent No.: US 10,304,876 B2
(45) Date of Patent: May 28, 2019

(54) METHOD FOR MANUFACTURING AN ARRAY SUBSTRATE, ARRAY SUBSTRATE AND DISPLAY DEVICE

(71) Applicants: Boe Technology Group Co., Ltd., Beijing (CN); Beijing Boe Optoelectronics Technology Co., Ltd., Beijing (CN)

(72) Inventors: Yiping Dong, Beijing (CN); Lei Zhang, Beijing (CN); Tianyou Gao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 64 days.

(21) Appl. No.: 15/514,073

(22) PCT Filed: May 31, 2016

(86) PCT No.: PCT/CN2016/084041
§ 371 (c)(1),
(2) Date: Mar. 24, 2017

(87) PCT Pub. No.: WO2017/156886
PCT Pub. Date: Sep. 21, 2017

(65) Prior Publication Data
US 2018/0175081 A1 Jun. 21, 2018

(30) Foreign Application Priority Data
Mar. 14, 2016 (CN) .......................... 2016 1 0145997

(51) Int. Cl.
*H01L 27/12* (2006.01)
*G03F 1/00* (2012.01)

(52) U.S. Cl.
CPC .......... *H01L 27/1288* (2013.01); *G03F 1/144* (2013.01); *H01L 27/124* (2013.01); *H01L 27/1244* (2013.01); *H01L 27/1262* (2013.01)

(58) Field of Classification Search
CPC .. H01L 27/12; H01L 27/1244; H01L 27/1262
See application file for complete search history.

(56) References Cited

U.S. PATENT DOCUMENTS

2003/0197182 A1 10/2003 Kim et al.
2013/0210201 A1* 8/2013 Tang .................. H01L 27/1288
438/151

(Continued)

FOREIGN PATENT DOCUMENTS

CN 1451996 10/2003
CN 101097895 1/2008

(Continued)

OTHER PUBLICATIONS

International Search Report and Written Opinion from PCT/CN16/84041 dated Dec. 19, 2016.

(Continued)

*Primary Examiner* — Phuc T Dang
(74) *Attorney, Agent, or Firm* — Calfee, Halter & Griswold LLP

(57) ABSTRACT

This disclosure relates to the field of display technologies, and discloses a method for manufacturing an array substrate, an array substrate, a grayscale mask plate and a display device. The method includes forming a transparent conductive layer and a metal layer sequentially on a base substrate. A photoresist pattern is formed on the base: substrate on which the transparent conductive layer and the metal layer have been formed The transparent conductive layer and the metal layer corresponding to a photoresist-free region are removed. The photoresist in a second photoresist region is removed. The metal layer corresponding to the second (Continued)

photoresist region is removed to expose a pixel electrode. Additionally, the photoresist in a first photoresist region is removed to expose a first electrode, a second electrode and a first data line.

17 Claims, 10 Drawing Sheets

(56) References Cited

U.S. PATENT DOCUMENTS

| | | | | |
|---|---|---|---|---|
| 2014/0134809 A1* | 5/2014 | Bai | ............... | H01L 27/1288 438/158 |
| 2015/0187825 A1* | 7/2015 | Xu | ............... | H01L 27/1288 438/158 |
| 2016/0104727 A1* | 4/2016 | Cai | ............... | H01L 27/124 257/72 |
| 2017/0310700 A1 | 10/2017 | Chen et al. | | |

FOREIGN PATENT DOCUMENTS

| | | |
|---|---|---|
| CN | 101097895 A | 1/2008 |
| CN | 103762199 | 4/2014 |
| CN | 103762199 A | 4/2014 |
| CN | 105140181 | 12/2015 |
| CN | 105140181 A | 12/2015 |

OTHER PUBLICATIONS

First Office Action for Chinese Patent Application No. 201610145997.9 dated Mar. 20, 2018.

* cited by examiner

METHOD FOR MANUFACTURING AN ARRAY SUBSTRATE, ARRAY SUBSTRATE AND DISPLAY DEVICE

The present application is the U.S. national phase entry of PCT/CN2016/084041, with an international filling date of May 31, 2016, which claims the benefit of Chinese Patent Application No. 201610145997.9, filed on Mar. 14, 2016, the entire disclosures of which are incorporated herein by reference.

FIELD

This disclosure relates to the field of display technologies, and in particular to a method for manufacturing an array substrate, an array substrate, a grayscale mask plate and a display device.

BACKGROUND ART

A thin-film transistor (TFT) on an array substrate comprises structures such as a source, a drain and a gate, wherein the source or the drain is connected with a data line. Data lines on the array substrate are long and thin, and hence would break easily. As a result, the array substrate cannot operate normally.

In the related art, there is a method for manufacturing an array substrate. In this method, a transparent conductive layer is formed first on a base substrate, and after that, a pixel electrode and a second data line are formed on the transparent conductive layer by a patterning process. Then, a source, a drain and a first data line are formed by a patterning process on the base substrate on which the pixel electrode and the second data line have been formed, wherein the second data line has a same shape as the first data line. In this case, the first data line is superimposed on the second data line, which has a same shape as the first data line. The second data line is used for reducing possible breakage of the first data line. Even if the first data line breaks, the second data line under that breakage will connect the data line at the breakage.

As has been found by the inventor, existing approaches such as the one indicated above at least contains the following defects: due to factors such as human errors or mechanical errors, the first data line may fail to be superimposed on the second data line, which results in invalidation of the second data line.

SUMMARY

In order to solve existing problems such as invalidation of the second data line when the first data line fails to be superimposed on the second data line due to factors such as human errors or mechanical errors, embodiments of this disclosure provide a method for manufacturing an array substrate, an array substrate, a grayscale mask plate and a display device.

According to a first aspect of this disclosure, a method for manufacturing an array substrate is provided. The method comprises steps of: forming a transparent conductive layer and a metal layer sequentially on a base substrate; forming a photoresist pattern on the base substrate on which the transparent conductive layer and the metal layer have been formed, wherein the photoresist pattern comprises a first photoresist region, a second photoresist region and a photoresist-free region, a photoresist thickness of the first photoresist region being greater than that of the second photoresist region, the first photoresist region comprising a first subregion and a second subregion, and a region other than the first photoresist region and the second photoresist region on the photoresist pattern being the photoresist-free region; removing the transparent conductive layer and the metal layer corresponding to the photoresist-free region, thereby forming a first electrode and a first data line by the metal layer corresponding to the first subregion of the first photoresist region and forming a second data line by the transparent conductive layer corresponding to the first subregion of the first photoresist region, and forming a second electrode by the metal layer corresponding to the second subregion of the first photoresist region; removing the photoresist in the second photoresist region; removing the metal layer corresponding to the second photoresist region, thereby forming a pixel electrode by the transparent conductive layer corresponding to the second photoresist region; and removing the photoresist in the first photoresist region, thereby exposing the first electrode, the second electrode and the first data line.

In certain embodiments, the first electrode is a first source, and the second electrode is a first drain. Alternatively, the first electrode is a first drain, and the second electrode is a first source.

In certain embodiments, the step of forming a photoresist pattern on the base substrate on which the transparent conductive layer and the metal layer have been formed comprises: forming the photoresist pattern by a grayscale mask process on the base substrate on which the transparent conductive layer and the metal layer have been formed.

In certain embodiments, the step of forming the photoresist pattern by a grayscale mask process on the base substrate on which the transparent conductive layer and the metal layer have been formed comprises: forming a photoresist layer on the base substrate on which the transparent conductive layer and the metal layer have been formed; and forming the photoresist pattern by performing exposure and development, with a grayscale mask plate, on the base substrate on which the photoresist layer has been formed, the grayscale mask plate comprising a first transmissive region, a second transmissive region and a third transmissive region, transmissivities of the first transmissive region, the second transmissive region and the third transmissive region increasing one after the other, the first transmissive region having a same shape as the first photoresist region, the second transmissive region having a same shape as the second photoresist region, and the third transmissive region having a same shape as the photoresist-free region.

In certain embodiments, the step of removing the photoresist in the second photoresist region comprises: continuously reducing a thickness of the photoresist pattern by an ashing process until all photoresist in the second photoresist region is removed.

In certain embodiments, the method further comprises: prior to removing the metal layer corresponding to the second photoresist region, performing an annealing treatment on the transparent conductive layer.

In certain embodiments, the step of removing the photoresist in the first photoresist region comprises: removing the photoresist in the first photoresist region by a lift-off process.

In certain embodiments, a material of the transparent conductive layer comprises indium tin oxides (ITO).

According to a second aspect of this disclosure, an array substrate is provided. The array substrate is manufactured by the above mentioned method and specifically comprises: the base substrate; a transparent conductive film pattern and a preset metal pattern sequentially formed on the base substrate, wherein the transparent conductive film pattern comprises the pixel electrode and the second data line, the preset metal pattern comprises the first electrode, the second electrode and the first data line, the first data line being formed above the second data line pattern.

In certain embodiments, the first electrode is a first source, and the second electrode is a first drain. Alternatively, the first electrode is a first drain, and the second electrode is a first source.

In certain embodiments, the transparent conductive film pattern further comprises a second source and a second drain.

According to a third aspect of this disclosure, a grayscale mask plate is provided. The grayscale mask plate comprises: a first transmissive region, a second transmissive region and a third transmissive region. Transmissivities of the first transmissive region, the second transmissive region and the third transmissive region increase one after the other. The first transmissive region comprises a first sub-transmissive region and a second sub-transmissive region. The first sub-transmissive region has a same shape as an entirety formed by the first electrode and the first data line. The second sub-transmissive) region has a same shape as the second electrode. The second transmissive region has a same shape as the pixel electrode. The third transmissive region is a region other than the first transmissive region and the second transmissive region on the grayscale mask plate.

In certain embodiments, the first electrode is a first source, and the second electrode is a first drain. Alternatively, the first electrode is a first drain, and the second electrode is a first source.

According to a fourth aspect of this disclosure, a display device is provided. The display device comprises any of the above mentioned array substrates according to the second aspect.

According to an embodiment of this disclosure, by forming the first data line and the second data line with a same photoresist pattern, the first data line can be right superimposed on the second data line. In this way, existing problems such as invalidation of the second data line when the first data line fails to be superimposed on the second data line due to factors such as human errors or mechanical errors can be solved. Accordingly, effects such as superimposing the first data line right on the second data line will be achieved.

BRIEF DESCRIPTION OF DRAWINGS

In order to illustrate technical solutions in embodiments of this disclosure more clearly, drawings to be used in depictions of the embodiments will be briefly introduced below. Apparently, drawings in those depictions below are only some embodiments of this disclosure. For those having ordinary skills in the art, other embodiments can be further obtained from these drawings without any inventive efforts.

FIG. 1-2 is a schematic structure view depicting the array substrate in the embodiment as shown in FIG. 1-1;

FIG. 2-1 is a flow diagram depicting a further method for manufacturing an array substrate as provided in an embodiment of this disclosure;

FIG. 2-2 is a schematic structure view depicting the array substrate in the embodiment as shown in FIG. 2-1;

FIG. 2-3 is a flow diagram depicting how to form a photoresist pattern in the embodiment as shown in FIG. 2-1;

FIGS. 2-4 to 2-13 are schematic structure views depicting a base substrate in the embodiment as shown in FIG. 2-1;

FIG. 3-1 is a schematic structure view depicting an array substrate as provided in an embodiment of this disclosure;

FIG. 3-2 is a section view depicting the array substrate as shown in FIG. 3-1; and FIG. 4 is a schematic structure view depicting a grayscale mask plate as provided in an embodiment of this disclosure.

With the above drawings, specific embodiments of this disclosure have been shown, which will be depicted in detail as follows. The drawings and the literal depictions are not intended to limit the scope of this disclosure in any way, but explain the principle of this disclosure to those skilled in the art with reference to particular embodiments.

DETAILED DESCRIPTION OF EMBODIMENTS

In order to render the goals, technical solutions and advantages of this disclosure much clearer, embodiments of this disclosure will be further illustrated below in detail with reference to the drawings.

In each drawing, meanings of the reference signs are as follows: 21—base substrate, 222—pixel electrode, 41—preset metal pattern, 22—transparent conductive layer, 23—metal layer, 30—other film layer, A—first photoresist region, B—second photoresist region, C—photoresist-free region, x—section taken position, 231—first electrode and first data line, 231a—first electrode, 231b—first data line, 233—second electrode, 411—first source, 412—first drain, 50—grayscale mask plate, 51—first transmissive region, 52—second transmissive region, 53—third transmissive region.

Figure 1:
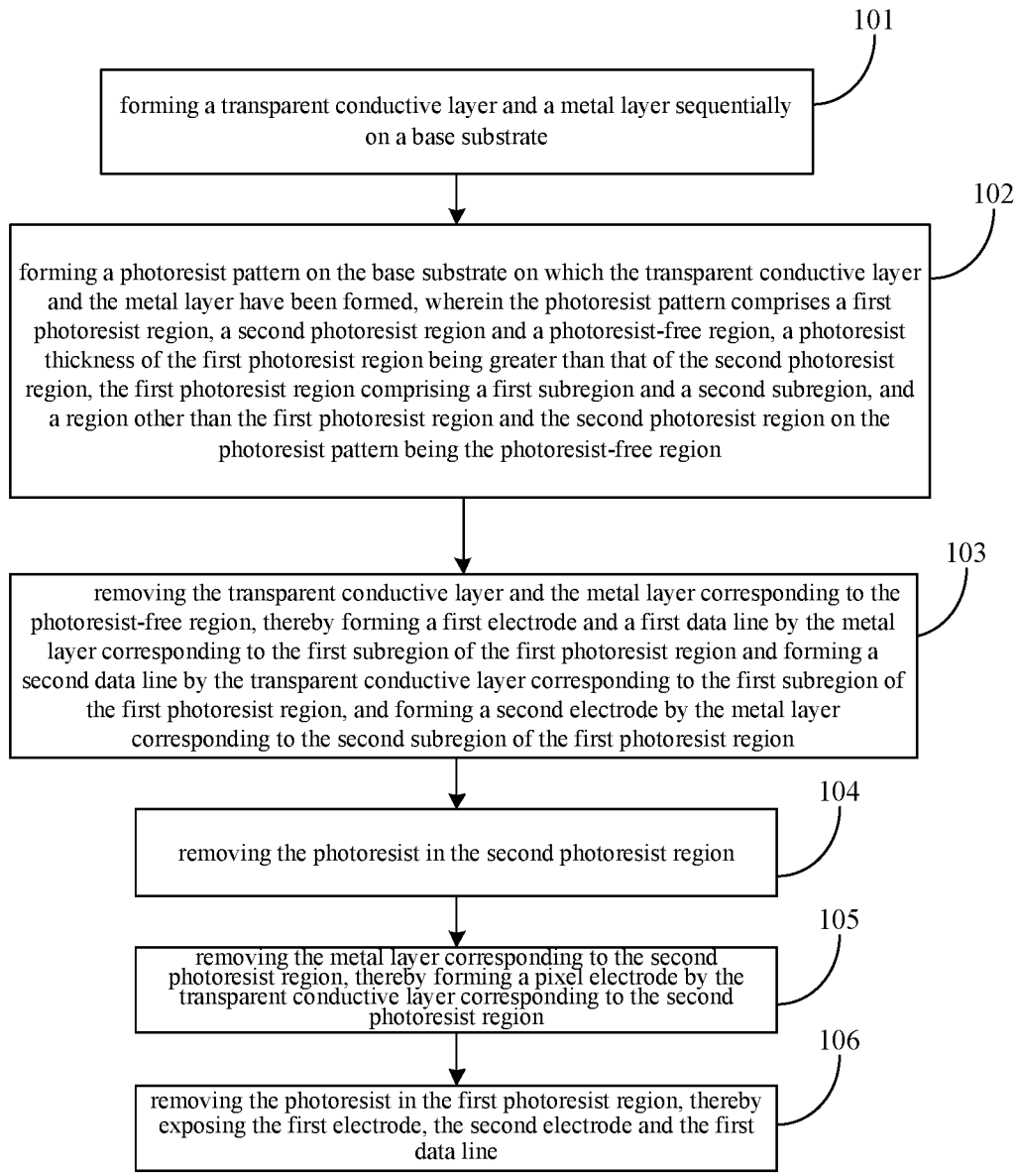
FIG. 1-1 is a flow diagram depicting a method for manufacturing an array substrate as provided in an embodiment of this disclosure.

FIG. 1-1 is a flow diagram depicting a method for manufacturing an array substrate as provided in an embodiment of this disclosure. The method for manufacturing an array substrate can comprise steps as follows.

In step 101, a transparent conductive layer and a metal layer are sequentially formed on a base substrate.

In step 102, a photoresist pattern is formed on the base substrate on which the transparent conductive layer and the metal layer have been formed. Specifically, the photoresist pattern comprises a first photoresist region, a second photoresist region and a photoresist-free region. A photoresist thickness of the first photoresist region is greater than that of the second photoresist region. The first photoresist region comprises a first subregion and a second subregion. Besides, a region other than the first photoresist region and the second photoresist region on the photoresist pattern can be selected to be the photoresist-free region.

In step 103, the transparent conductive layer and the metal layer corresponding to the photoresist-free region are removed. In this way, a first electrode and a first data line can be formed by the metal layer corresponding to the first subregion of the first photoresist region, and a second data line can be formed by the transparent conductive layer corresponding to the first subregion of the first photoresist region. Besides, a second electrode can also be formed by the metal layer corresponding to the second subregion of the first photoresist region. Specifically, the first electrode can be a first source, and the second electrode can be a first drain, or vice versa.

In step 104, the photoresist is removed in the second photoresist region.

In step 105, the metal layer corresponding to the second photoresist region is removed. Thereby, a pixel electrode will be formed by the transparent conductive layer corresponding to the second photoresist region.

In step 106, the photoresist in the first photoresist region is removed, thereby exposing the first electrode, the second electrode and the first data line.

Figures 1, 2:
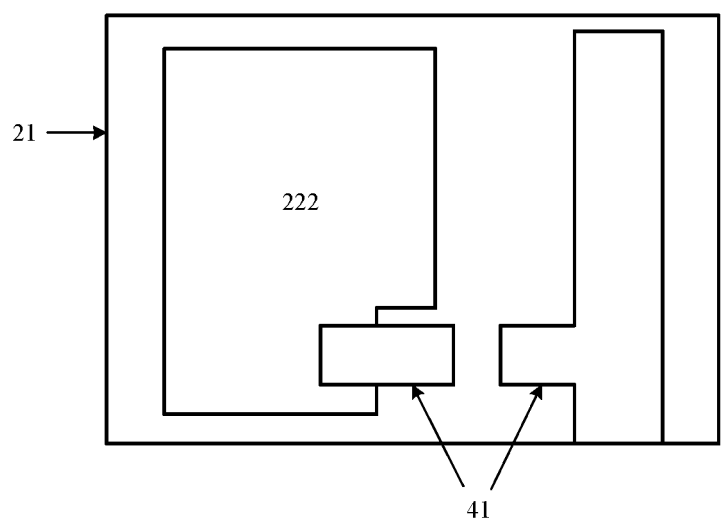

At the end of this step, the base substrate can be shown structurally in FIG. 1-2. Specifically, a pixel electrode 222 and a preset metal pattern 41 are formed sequentially on the base substrate 21. The preset metal pattern 41 comprises a first source, a first drain and a first metal line.

To sum up, according to the method for manufacturing an array substrate as provided in embodiments of this disclosure, by forming the first data line and the second data line with a same photoresist pattern, the first data line can be right superimposed on the second data line. In this way, existing problems such as invalidation of the second data line when the first data line fails to be superimposed on the second data line due to factors such as human errors or mechanical errors can be solved. Accordingly, effects such as superimposing the first data line right on the second data line will be achieved.

FIG. 2-1 is a flow diagram depicting a further method for manufacturing an array substrate as provided in an embodiment of this disclosure. The method for manufacturing an array substrate can comprise steps as follows.

In step 201, a transparent conductive layer and a metal layer are formed sequentially on a base substrate.

When the method for manufacturing an array substrate as provided in the embodiments of this disclosure is used, a transparent conductive layer and a metal layer can be formed sequentially on a base substrate. Specifically, the transparent conductive layer can be made of indium tin oxides (ITO) or other transparent conductive materials. Furthermore, the metal layer can be used for forming a first source, a first drain and a first data line. At the end of this step, the base substrate can be shown structurally in FIG. 2-2. Specifically, the transparent conductive layer 22 and the metal layer 23 are sequentially formed on the base substrate 21. Other film layers 30 can also be formed between the transparent conductive layer 22 and the base substrate 21. The other film layers 30 can comprise a gate, a gate insulating layer, a semiconductor layer and so on. Besides, the other film layers 30 can also be formed on the base substrate 21 prior to this step. For specific implementations, related techniques can be referred to, which will not be described here for simplicity.

In step 202, a photoresist pattern is formed by a grayscale mask process on the base substrate on which the transparent conductive layer and the metal layer have been formed.

After the transparent conductive layer and the metal layer have been formed on the base substrate, a photoresist pattern can be formed by a grayscale mask process on the base substrate on which the transparent conductive layer and the metal layer have been formed. The photoresist pattern comprises a first photoresist region, a second photoresist region and a photoresist-free region. A photoresist thickness of the first photoresist region is greater than that of the second photoresist region. The first photoresist region comprises a first subregion and a second subregion. A region other than the first photoresist region and the second photoresist region on the photoresist pattern can be selected as the photoresist-free region.

The grayscale mask process can refer to an optical process using a grayscale mask plate. The grayscale mask plate is a mask plate, whose mask plate plane can have different transmissivities for different regions and whose mask plate plane can comprise three regions with different transmissivities. A lower transmissivity a region has, less light passes through the region during exposure, and the greater photoresist thickness a corresponding region on the photoresist layer will have. Correspondingly, a higher transmissivity a region has, more light passes through the region during exposure, and the less photoresist thickness a corresponding region on the photoresist layer will have.

Figures 1, 2:
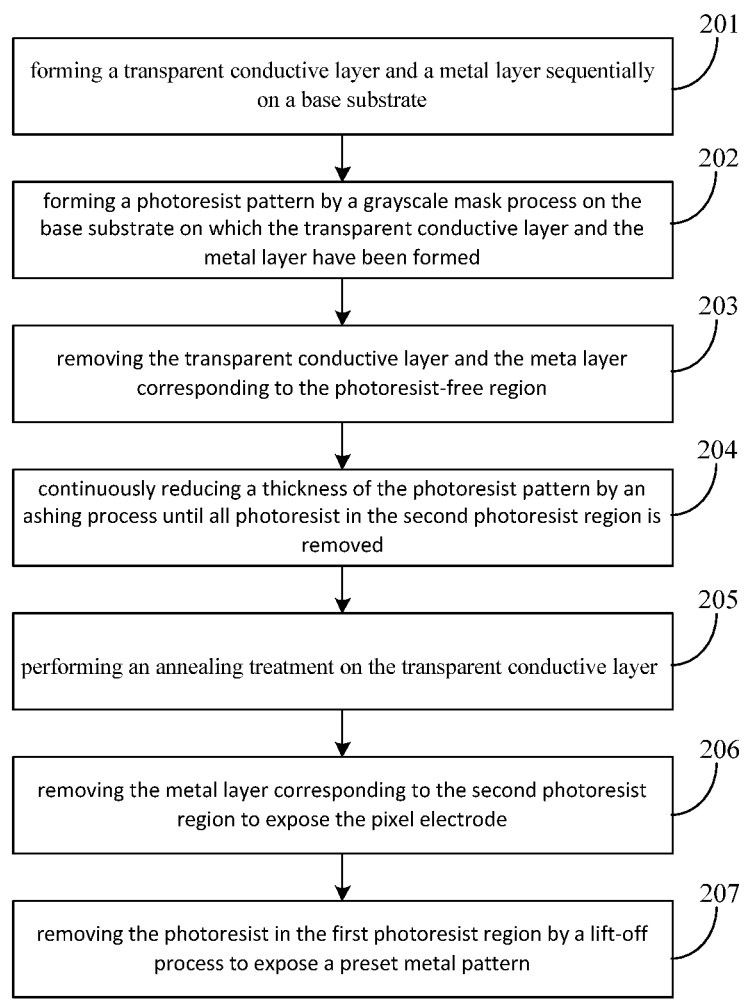
Figure 2:
Figures 2, 3:
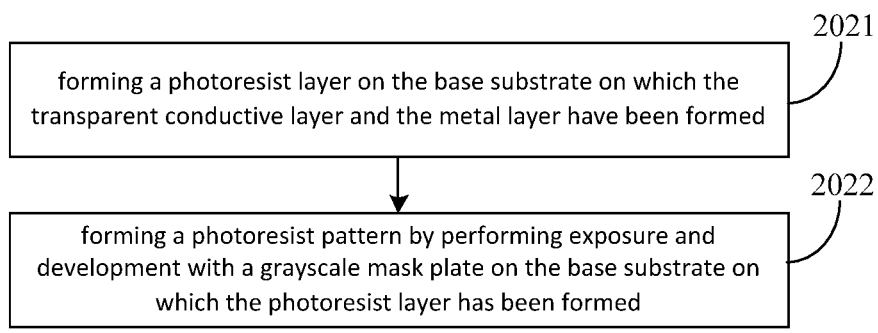

As shown in FIG. 2-3, this step can comprise two substeps as follows.

In substep 2021, a photoresist layer is formed on the base substrate on which the transparent conductive layer and the metal layer have been formed. Firstly, a photoresist layer can be formed on the base substrate on which the transparent conductive layer and the metal layer have been formed.

In substep 2022, a photoresist pattern is formed by performing exposure and development with a grayscale mask plate on the base substrate on which the photoresist layer has been formed. After the photoresist layer has been formed on the base substrate, a photoresist pattern can be formed by performing exposure and development with a grayscale mask plate on the base substrate on which the photoresist layer has been formed.

It should be noted that for procedures such as performing exposure and development with a grayscale mask plate on the base substrate on which the photoresist layer has been formed, the operation procedure relevant with an ordinary mask plate (a mask plate whose mask plate plane comprises two regions with different transmissivities) in the related art can be referred to, which will not be described here for simplicity.

In an embodiment of this disclosure, the grayscale mask plate can comprise a first transmissive region, a second transmissive region and a third transmissive region. Transmissivities of the first transmissive region, the second transmissive region and the third transmissive region increase one after the other. The first transmissive region has a same shape as the first photoresist region. The second transmissive region has a same shape as the second photoresist region. The third transmissive region has a same shape as the photoresist-free region. With this grayscale mask plate, a photoresist pattern comprising a first photoresist region, a second photoresist region and a photoresist-free region can be formed on the photoresist layer. At the end of this step, the base substrate can be shown structurally in FIG. 2-4. Specifically, the photoresist pattern 24 is formed above a metal layer (not shown), wherein region A is the first photoresist region (wherein region A on the right is a first subregion, and region A on the left is a second subregion), region B is the second photoresist region, region C is the photoresist-free region, and the section at position x can be shown in FIG. 2-5. FIG. 2-5 is a section view depicting the base substrate shown in FIG. 2-4 at position x. In FIG. 2-5, the reference numeral 23 refers to a metal layer. For meanings of other reference signs, FIGS. 2-4 can be referred to, which will not be described here for simplicity.

In step 203, the transparent conductive layer and the meta layer corresponding to the photoresist-free region are removed.

After a photoresist pattern has been formed on the base substrate, the transparent conductive layer and the meta layer corresponding to the photoresist-free region can be removed. Accordingly, a first electrode and a first data line are formed by the metal layer corresponding to the first subregion of the first photoresist region, and a second data line are formed by the transparent conductive layer corresponding to the first subregion of the first photoresist region. Besides, a second electrode is formed by the metal layer corresponding to the second subregion of the first photoresist region. Specifically, the first electrode can be a first source, and the second electrode can be a first drain, or vice versa.

In certain embodiments, the metal layer and the transparent conductive layer can be sequentially etched with different etchants, so as to remove the transparent conductive layer and the meta layer corresponding to the photoresist-free region. When the transparent conductive layer is etched by an etchant of the transparent conductive layer, the metal layer is covered by photoresist except in the photoresist-free region, which prevents the metal layer from being damaged by the etchant of the transparent conductive layer.

At the end of this step, the section structure of the base substrate can be shown in FIG. 2-6. In this figure, the reference numeral 231 refers to the first electrode and the first data line, 221 refers to a pattern (comprising the second data line) formed on the transparent conductive layer having a same shape as an entirety of the first electrode and the first data line, 30 refers to other film layers, region A is the first photoresist region, region B is the second photoresist region, and region C is the photoresist-free region. Referring to FIG. 2-7, a plan view of the base substrate shown in FIG. 2-6 is illustrated. In this figure, the reference numeral 30 refers to other film layers exposed after the transparent conductive layer and the metal layer corresponding to the photoresist-free layer have been removed, region A is the first photoresist region, and region B is the second photoresist region. Besides, the section view at position x can be shown in FIG. 2-6.

In step 204, continuously reducing a thickness of the photoresist pattern by an ashing process, until all photoresist in the second photoresist region has been removed.

After the transparent conductive layer and the metal layer corresponding to the photoresist-free layer have been removed, a thickness of the entire photoresist pattern (comprising the first photoresist region and the second photoresist region) is continuously reduced by an ashing process, until all photoresist in the second photoresist region is removed. Since the photoresist thickness of the first photoresist region is greater than that of the second photoresist region, now photoresist with a certain thickness still exists in the second photoresist region. Specifically, a thickness of the photoresist pattern can be reduced by implementing an ashing process with a dry etching device.

At the end of this step, the section structure of the base substrate can be shown in FIG. 2-8. Specifically, the photoresist in the second photoresist region B is removed, so as to expose a metal pattern 232 corresponding to the second photoresist region B. The photoresist thickness in the first photoresist region A is reduced. Region C is the photoresist-free region and the reference numeral 30 refers to other film layers.

FIG. 2-9 is a plan view of FIG. 2-8. For meanings of each reference sign in FIG. 2-9, FIG. 2-8 can be referred to, which will not be described here for simplicity. The section view at position x in FIG. 2-9 can be shown in FIG. 2-8.

In step 205, an annealing treatment is performed on the transparent conductive layer.

After all photoresist in the second photoresist region has been removed, an annealing treatment can be performed on the transparent conductive layer, so as to avoid damages to the transparent conductive layer during subsequent etching of the metal layer. The annealing treatment can be a low temperature annealing treatment, which can enhance the resistance of the transparent conductive layer to etching such that the transparent conductive layer will not be damaged by an etchant of the metal layer.

In step 206, the metal layer corresponding to the second photoresist region is removed, so as to expose the pixel electrode.

After an annealing treatment has been performed on the transparent conductive layer, the metal layer corresponding to the second photoresist region can be removed by an etchant of the metal layer, so as to expose the pixel electrode. Since the transparent conductive layer has been subjected to an annealing treatment, it will not be damaged by the etchant of the metal layer.

At the end of this step, the section structure of the base substrate can be shown in FIG. 2-10. After the metal layer corresponding to the second photoresist region B has been removed, the pixel electrode 222 is exposed, and the metal layer corresponding to the second subregion of the first photoresist region A forms a second electrode 233. The second electrode 233 is a first source or a first drain (when the first electrode is a first source, the second electrode is a first drain; and when the first electrode is a first drain, the second electrode is a first source). Besides, the reference sign 30 refers to other film layers.

FIG. 2-11 is a plan view of the base substrate shown in FIG. 2-10. For meanings of each sign in FIG. 2-11, FIG. 2-10 can be referred to, which will not be described here for simplicity. The section at position x in FIG. 2-11 can be shown in FIGS. 2-10.

In step 207, the photoresist in the first photoresist region is removed by a lift-off process, so as to expose a preset metal pattern comprising a first electrode, a second electrode and a first data line.

After the metal layer corresponding to the second photoresist region has been removed, the photoresist in the first photoresist region can be removed by a lift-off process, so as to expose a preset metal pattern.

At the end of this step, the base substrate can be shown structurally in FIG. 2-12. Specifically, the reference sign 231 refers to a first electrode and a first data line, 221 refers to a transparent conductive layer having a same shape as 231 (the first electrode and the first data line), 233 refers to a second electrode, 222 refers to a pixel electrode, and 30 refers to other film layers.

FIG. 2-13 is a plan view depicting the base substrate shown in FIG. 2-12, wherein the reference sign 233 refers to a second electrode, 222 refers to a pixel electrode, 30 refers to other film layers, 231a refers to a first electrode, and 231b refers to a first data line. Besides, the section at position x in FIG. 2-13 can be shown in FIG. 2-12.

At the end of this step, the pixel electrode, the first source, the first drain, the first data line and the second data line on the base substrate have been manufactured. After that, the other film layers on the base substrate can be manufactured by subsequent processes. For specific implementation, related techniques can be referred to, which will not be described here for simplicity.

It should be supplemented that according to the method for manufacturing an array substrate as provided in embodiments of this disclosure, by performing an annealing treatment on the transparent conductive layer, effects such as preventing the transparent conductive layer from being damaged during etching of the metal layer can be achieved.

It should be supplemented that according to the method for manufacturing an array substrate as provided in embodiments of this disclosure, by reducing a thickness of the photoresist pattern by an ashing process, effects such as removing all photoresist in the second photoresist region while retaining photoresist with a certain thickness in the first photoresist region will be achieved.

It should be supplemented that according to the method for manufacturing an array substrate as provided in embodiments of this disclosure, by performing exposure with a grayscale mask plate on the base substrate on which the photoresist layer has been formed, effects such as forming photoresist with different thicknesses can be achieved.

To sum up, according to the method for manufacturing an array substrate as provided in embodiments of this disclosure, by forming the first data line and the second data line with a same photoresist pattern, the first data line can be right superimposed on the second data line. In this way, existing problems such as invalidation of the second data line when the first data line fails to be superimposed on the second data line due to factors such as human errors or mechanical errors can be solved. Accordingly, effects such as superimposing the first data line right on the second data line will be achieved.

FIG. 3-1 is a schematic structure view of an array substrate as provided in an embodiment of this disclosure. The array substrate can be manufactured by the method as shown in FIG. 1-1 or FIG. 2-1. The array substrate comprises: a base substrate 21; and a transparent conductive film pattern (not shown) and a preset metal pattern 41 sequentially formed on the base substrate 21. The transparent conductive film pattern comprises a pixel electrode, a second source, a second drain and a second data line. The preset metal pattern 41 comprises a first source 411, a first drain 412 and a first data line 231b. The first data line 231b is formed above the second data line. In the case shown in FIG. 3-1, the reference sign 411 refers to a first source and 412 refers to a first drain. Obviously, the base substrate can also have such a structure that 411 refers to a first drain and 412 refers to a first source. Besides, other film layers 30 can also be formed between the base substrate 21 and the transparent conductive layer, which will not be limited in this embodiment of the present disclosure. The section at position x in FIG. 3-1 can be shown in FIG. 3-2. For meanings of each sign in FIG. 3-2, FIG. 3-1 can be referred to, which will not be described here for simplicity.

This disclosure further provides a display device. The display device can comprise a array substrate as shown in FIG. 3-1.

Figures 2, 3, 4:
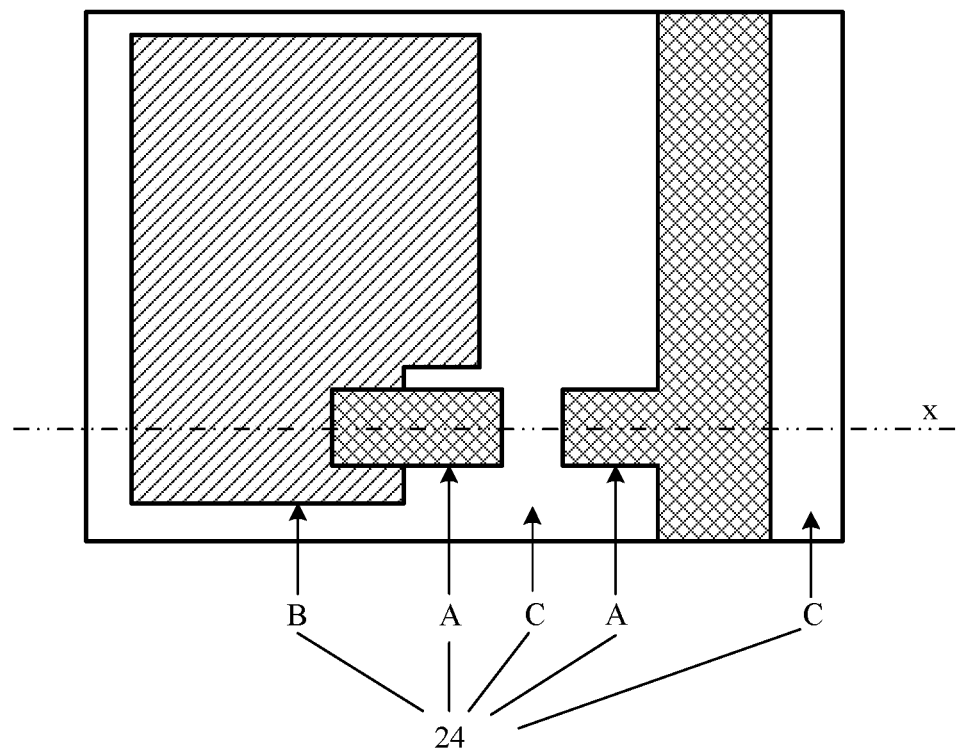
Figures 2, 3, 4, 5:
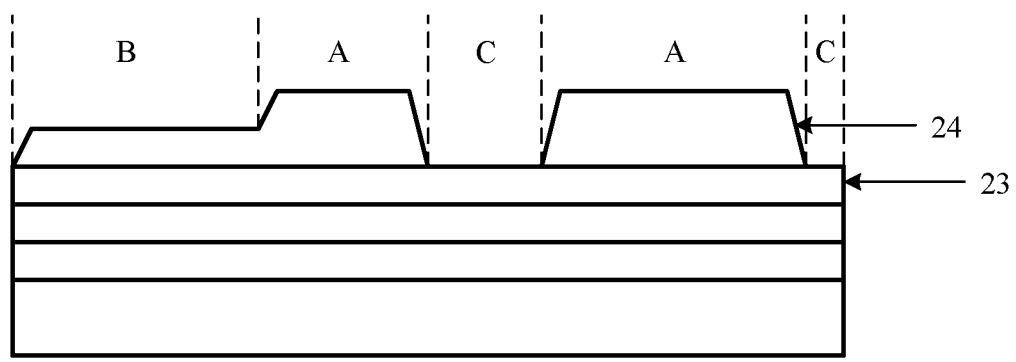
Figures 2, 3, 4, 5, 6:
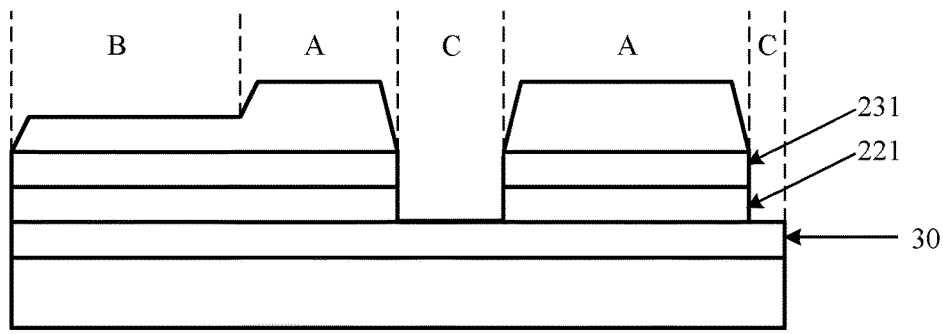
Figures 2, 3, 4, 5, 6, 7:
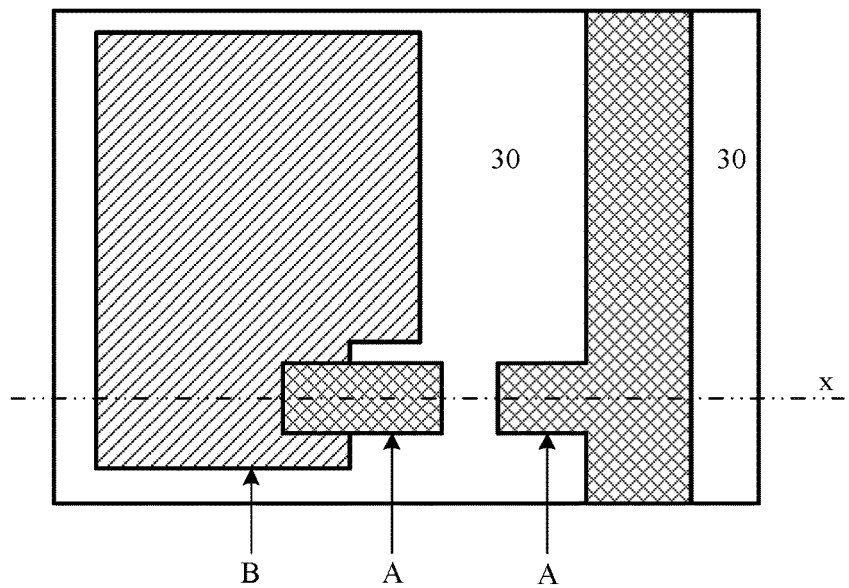
Figures 2, 3, 4, 5, 6, 7, 8:
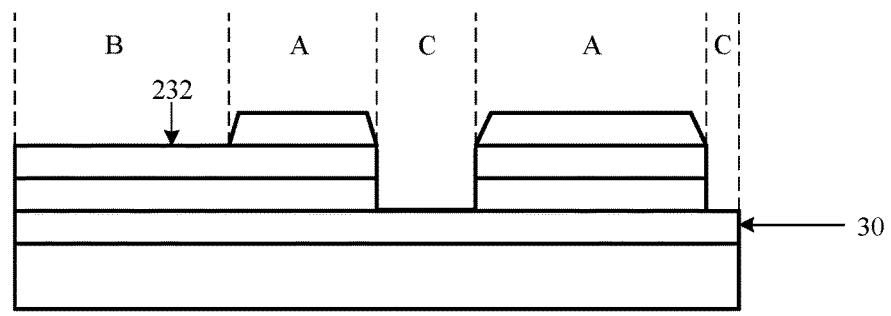
Figures 2, 3, 4, 5, 6, 7, 8, 9:
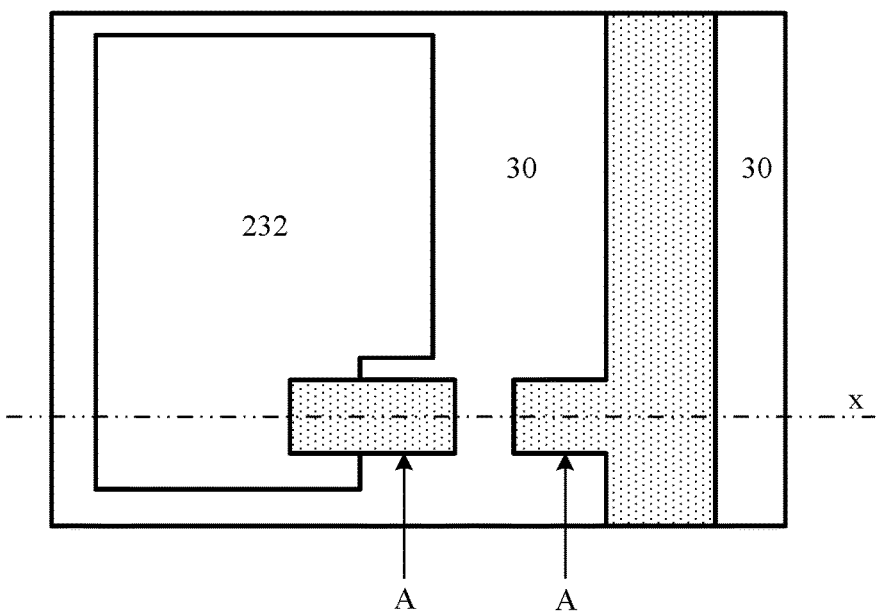
Figures 2, 3, 4, 5, 6, 7, 8, 9, 10:
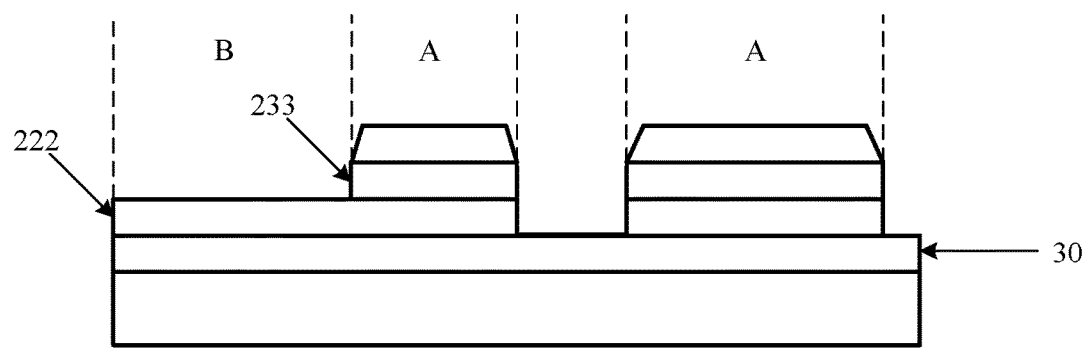
Figures 2, 3, 4, 5, 6, 7, 8, 9, 10, 11:
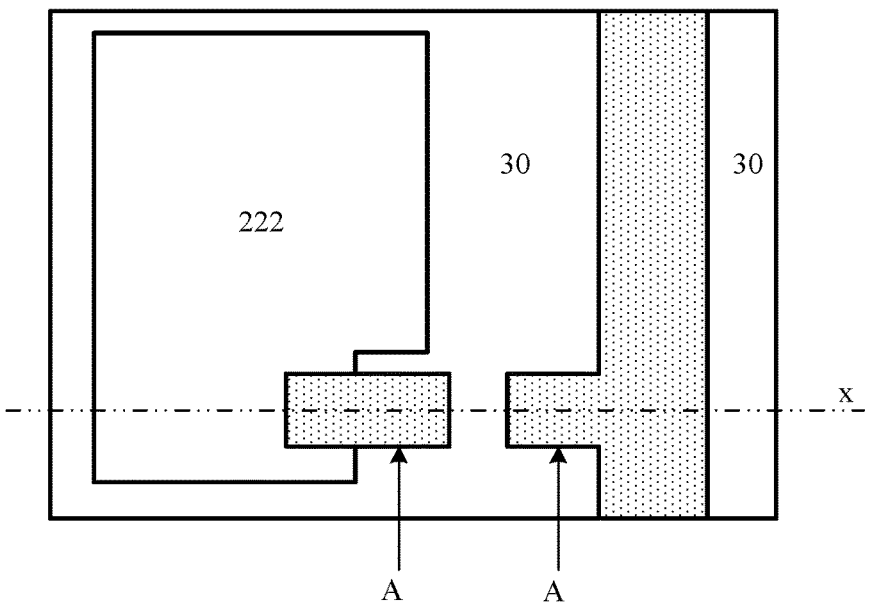
Figures 2, 3, 4, 5, 6, 7, 8, 9, 10, 11, 12:
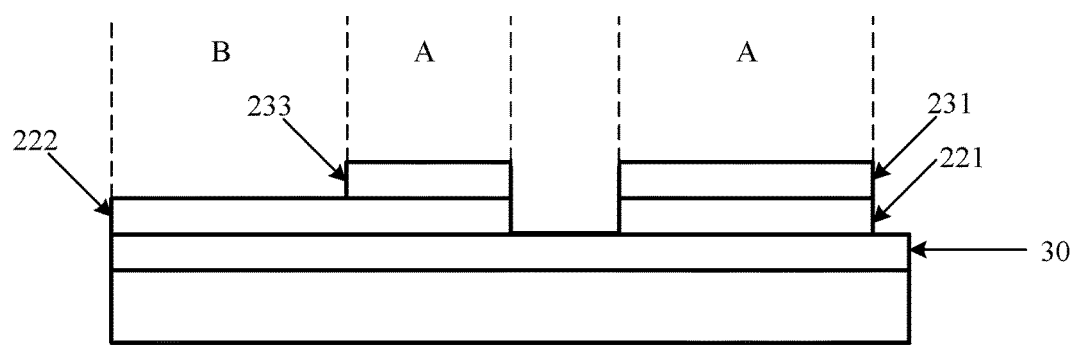
Figures 2, 3, 4, 5, 6, 7, 8, 9, 10, 11, 12, 13:
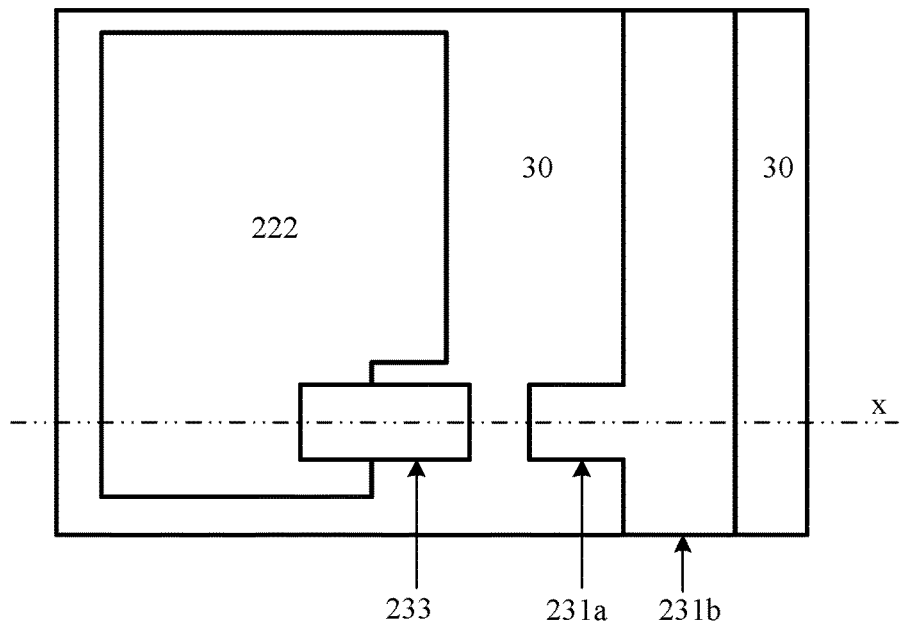
Figures 1, 3:
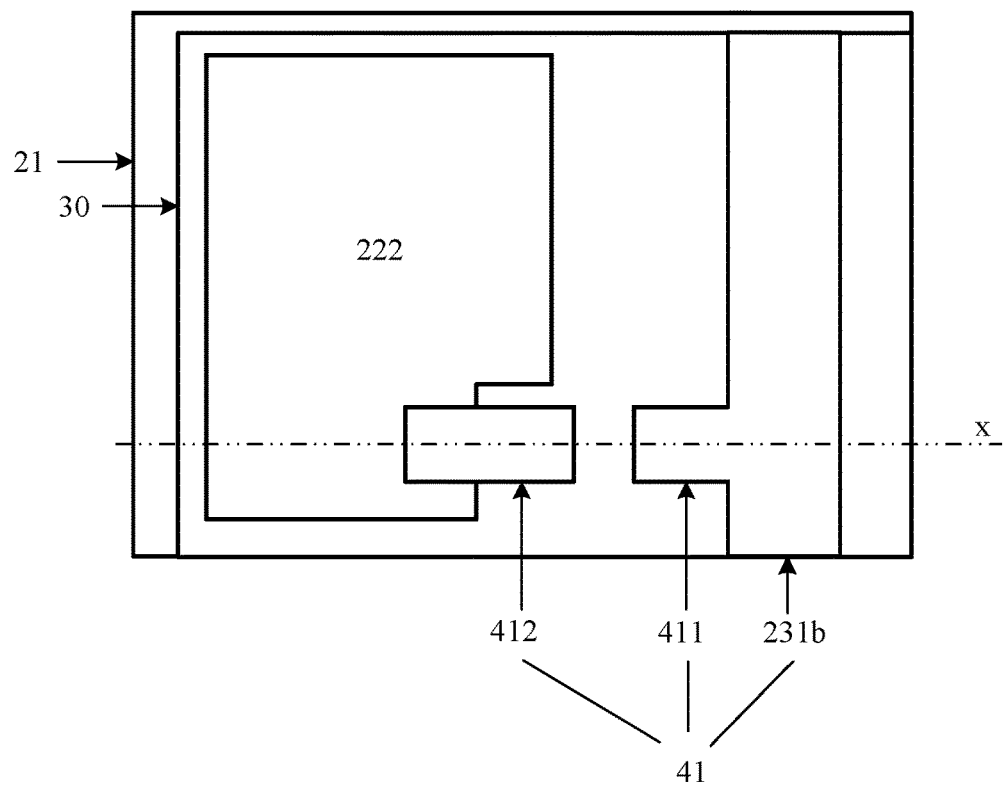
Figures 2, 3:
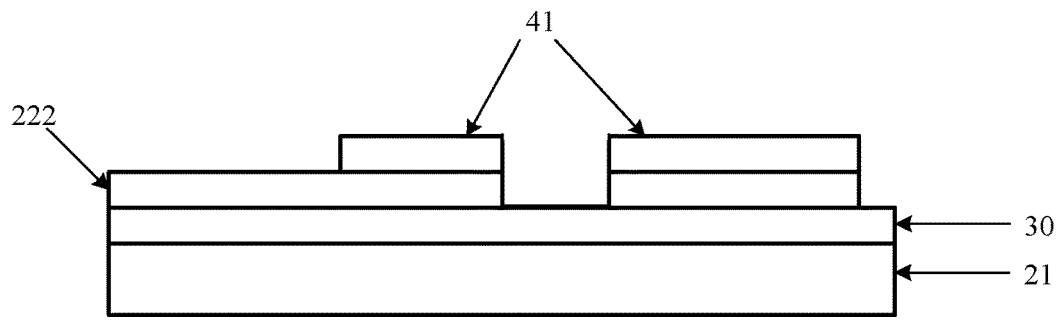
Figure 4:
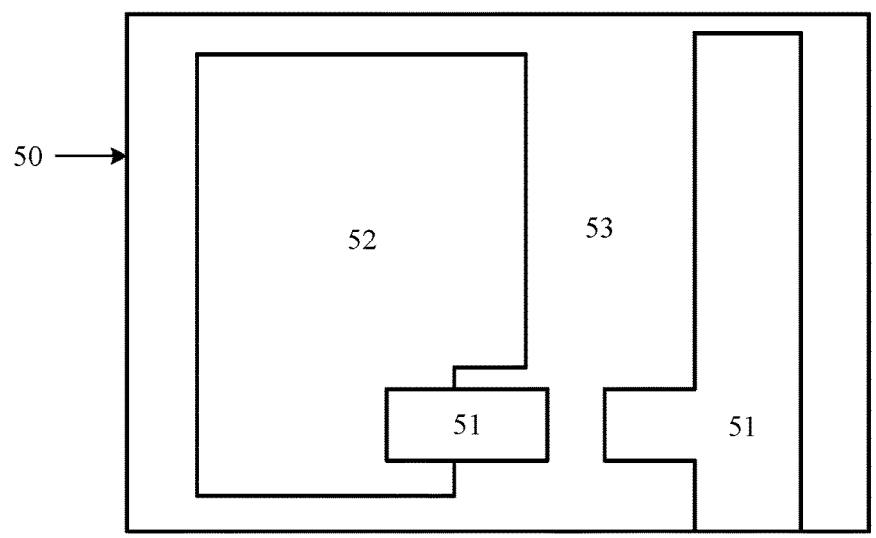

FIG. 4 is a schematic structure view depicting a grayscale mask plate as provided in an embodiment of this disclosure. The grayscale mask plate 50 comprises: a first transmissive region 51, a second transmissive region 52 and a third transmissive region 53. Transmissivities of the first transmissive region 51, the second transmissive region 52 and the third transmissive region 53 increase one after the other. The first transmissive region 51 comprises a first sub-transmissive region and a second sub-transmissive region. The first sub-transmissive region has a same shape as an entirety formed by the first electrode and the first data line. The second sub-transmissive region has a same shape as the second electrode. The second transmissive region 52 has a same shape as the pixel electrode. The third transmissive region 53 is a region other than the first transmissive region 51 and the second transmissive region 52 on the grayscale mask plate. Specifically, referring to FIG. 4, the first transmissive region 51 on the left is a first sub-transmissive region, and the first transmissive region 51 on the right is a second sub-transmissive region.

Those having ordinary skills in the art can understand that all or part of the steps for implementing the above embodiments can be carried out either by hardware, or by hardware associated with program instructions. The program can be stored in a computer-readable storage medium. The storage medium mentioned above can be an ROM, a magnetic disk, an optical disk or the like.

The above contents are only preferred embodiments of this disclosure, but not intended to limit this disclosure. Any modification, equivalent replacement, improvement and so on made within spirits and principles of this disclosure shall fall within the protection scope of this disclosure.

The invention claimed is:

1. A method for manufacturing an array substrate comprising steps of:

forming a transparent conductive layer and a metal layer sequentially on a base substrate;

forming a photoresist pattern on the base substrate on which the transparent conductive layer and the metal layer have been formed, wherein the photoresist pattern comprises a first photoresist region, a second photoresist region and a photoresist-free region, a photoresist thickness of the first photoresist region being greater than that of the second photoresist region, the first photoresist region comprising a first subregion and a second subregion, and a region other than the first photoresist region and the second photoresist region on the photoresist pattern being the photoresist-free region;

removing the transparent conductive layer and the metal layer corresponding to the photoresist-free region, thereby forming a first electrode and a first data line by the metal layer corresponding to the first subregion of the first photoresist region and forming a second data line by the transparent conductive layer corresponding to the first subregion of the first photoresist region, and forming a second electrode by the metal layer corresponding to the second subregion of the first photoresist region;

removing the photoresist in the second photoresist region;

removing the metal layer corresponding to the second photoresist region, thereby forming a pixel electrode by the transparent conductive layer corresponding to the second photoresist region; and removing the photoresist in the first photoresist region, thereby exposing the first electrode, the second electrode and the first data line.

2. The method according to claim 1, wherein the step of forming a photoresist pattern on the base substrate on which the transparent conductive layer and the metal layer have been formed comprises:

forming the photoresist pattern by a grayscale mask process on the base substrate on which the transparent conductive layer and the metal layer have been formed.

3. The method according to claim 2, wherein the step of forming the photoresist pattern by a grayscale mask process on the base substrate on which the transparent conductive layer and the metal layer have been formed comprises:

forming a photoresist layer on the base substrate on which the transparent conductive layer and the metal layer have been formed; and forming the photoresist pattern by performing exposure and development, with a grayscale mask plate, on the base substrate on which the photoresist layer has been formed, the grayscale mask plate comprising a first transmissive region, a second transmissive region and a third transmissive region, transmissivities of the first transmissive region, the second transmissive region and the third transmissive region increasing one after the other, the first transmissive region having a same shape as the first photoresist region, the second transmissive region having a same shape as the second photoresist region, and the third transmissive region having a same shape as the photoresist-free region.

4. The method according to claim 1, wherein the step of removing the photoresist in the second photoresist region comprises:
   continuously reducing a thickness of the photoresist pattern by an ashing process until all photoresist in the second photoresist region is removed.

5. The method according to claim 1, wherein the method further comprises:
   prior to removing the metal layer corresponding to the second photoresist region, performing an annealing treatment on the transparent conductive layer.

6. The method according to claim 1, wherein the step of removing the photoresist in the first photoresist region comprises:
   removing the photoresist in the first photoresist region by a lift-off process.

7. The method according to claim 1, wherein a material of the transparent conductive layer comprises indium tin oxides (ITO).

8. The method according to claim 1, wherein the first electrode is a first source, and the second electrode is a first drain.

9. The method according to claim 1, wherein the first electrode is a first drain, and the second electrode is a first source.

10. An array substrate comprising:
    the a base substrate; and
    a transparent conductive film pattern and a preset metal pattern sequentially formed on the base substrate, wherein the transparent conductive film pattern comprises a pixel electrode and a second data line, the preset metal pattern comprises a first electrode, a second electrode and a first data line, the first data line being formed above the second data line;
    wherein the array substrate is manufactured by a method comprising steps of:
    forming a transparent conductive layer and a metal layer sequentially on the base substrate;
    forming a photoresist pattern on the base substrate on which the transparent conductive layer and the metal layer have been formed, wherein the photoresist pattern comprises a first photoresist region, a second photoresist region and a photoresist-free region, a photoresist thickness of the first photoresist region being greater than that of the second photoresist region, the first photoresist region comprising a first subregion and a second subregion, and a region other than the first photoresist region and the second photoresist region on the photoresist pattern being the photoresist-free region;
    removing the transparent conductive layer and the metal layer corresponding to the photoresist-free region, thereby forming the first electrode and the first data line by the metal layer corresponding to the first subregion of the first photoresist region and forming the second data line by the transparent conductive layer corresponding to the first subregion of the first photoresist region, and forming the second electrode by the metal layer corresponding to the second subregion of the first photoresist region;
    removing the photoresist in the second photoresist region;
    removing the metal layer corresponding to the second photoresist region, thereby forming the pixel electrode by the transparent conductive layer corresponding to the second photoresist region; and
    removing the photoresist in the first photoresist region, thereby exposing the first electrode, the second electrode and the first data line.

11. The array substrate according to claim 10, wherein the first electrode is a first source, and the second electrode is a first drain.

12. The array substrate according to claim 10, wherein the first electrode is a first drain, and the second electrode is a first source.

13. The array substrate according to claim 10, wherein the transparent conductive film pattern further comprises a second source and a second drain.

14. A display device, comprising the array substrate according to claim 10.

15. The display device according to claim 14, wherein the first electrode is a first source, and the second electrode is a first drain.

16. The display device according to claim 14, wherein the first electrode is a first drain, and the second electrode is a first source.

17. The display device according to claim 14, wherein the transparent conductive film pattern further comprises a second source and a second drain.

* * * * *